United States Patent [19]

Kern

[11] Patent Number: 4,812,745

[45] Date of Patent: Mar. 14, 1989

[54] PROBE FOR TESTING ELECTRONIC COMPONENTS

[75] Inventor: Walter P. Kern, Cohasset, Mass.

[73] Assignee: Teradyne, Inc., Boston, Mass.

[21] Appl. No.: 56,102

[22] Filed: May 29, 1987

[51] Int. Cl.$^4$ .............................................. G01R 1/06
[52] U.S. Cl. ................................ 324/158 P; 324/72.5
[58] Field of Search ............... 324/158 P, 72.5, 158 F, 324/73 PC

[56] References Cited

U.S. PATENT DOCUMENTS

| | | | |
|---|---|---|---|
| 3,361,865 | 1/1968 | Giedd | 324/158 P |
| 3,445,770 | 5/1969 | Harmon | 324/158 P |
| 3,684,960 | 8/1972 | Conley, Jr. et al. | 324/73 PC |
| 3,911,361 | 10/1975 | Bove et al. | 324/158 P |
| 4,035,722 | 7/1977 | Raybov et al. | 324/72.5 |
| 4,214,201 | 7/1980 | Kern | 324/158 P |
| 4,523,144 | 6/1985 | Okubo et al. | 324/158 P |

*Primary Examiner*—Ernest F. Karlsen

[57] ABSTRACT

A probe for electrically contacting a lead of an electronic component providing accurate spacing between tip portions by using an insulator guide having holes through it and positioning wires in the holes so that tip portions of the wires extend from a probe surface.

11 Claims, 1 Drawing Sheet

PROBE FOR TESTING ELECTRONIC COMPONENTS

FIELD OF THE INVENTION

The invention relates to probes for testing electronic components.

BACKGROUND OF THE INVENTION

My U.S. Pat. No. 4,214,201, which is hereby incorporated by reference, discloses a three-tipped probe for contacting an electronic component lead at three points that are along an axis and have equal length segments between the two outer points and the middle point. The three contacts are supported in grooves of a plastic support and have resilient, bent contact ends extending from the grooves. Two of the contacts are L-shaped torsion spring contact elements, the contact end legs of the L's being movable between the rest and operating positions in planes perpendicular to the axis so as to maintain spacing of the tips during movement.

SUMMARY OF THE INVENTION

It has been discovered that a probe for electrically contacting a lead of an electronic component can be provided with accurate spacing between tip portions by using an insulator guide having holes through it and positioning wires in the holes so that tip portions of the wires extend from a probe surface of the guide. The tip portion positioning is thus accurately maintained by the positions of the holes in the guide, and is not dependent on bending of wires.

In preferred embodiments there are three wires, and the guide has three holes spaced along an axis to provide equal length segments between the outer two tip portions and the center tip portion; the guide is a flat plate, and there is a support plate below it, the wires being sandwiched between the two; the support plate is made of insulator material and carried conductive pads to which the wires are soldered; the guide plate and the support plate are made of glass-filled epoxy board providing flexibility along a contact axis that is perpendicular to the surface of the guide from which the tip portions extend; and the wires are tungsten wires.

Other features and advantages of the invention will be apparent from the following description of the preferred embodiment thereof and from the claims.

DESCRIPTION OF THE PREFERRED EMBODIMENT

The preferred embodiment will now be described.

DRAWINGS

STRUCTURE

Figure 1:
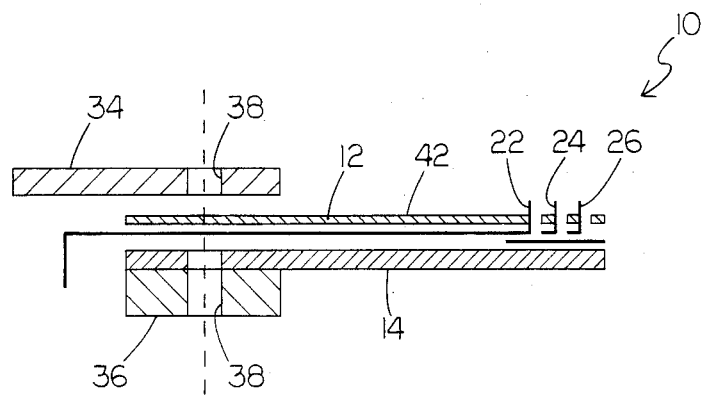
FIG. 1 is an exploded diagrammatic vertical sectional view of a probe according to the invention.
Figure 2:
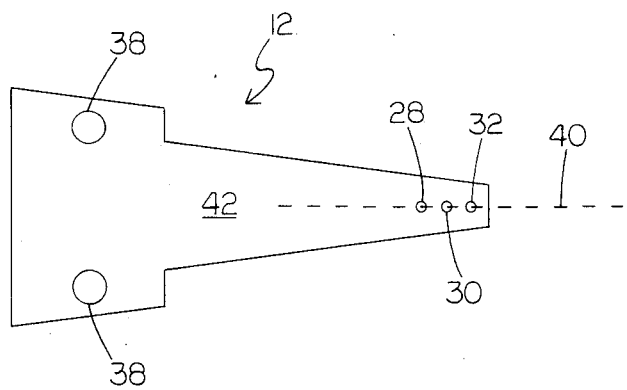
FIG. 2 is a plan view of a guide plate of the FIG. 1 probe.
Figure 3:
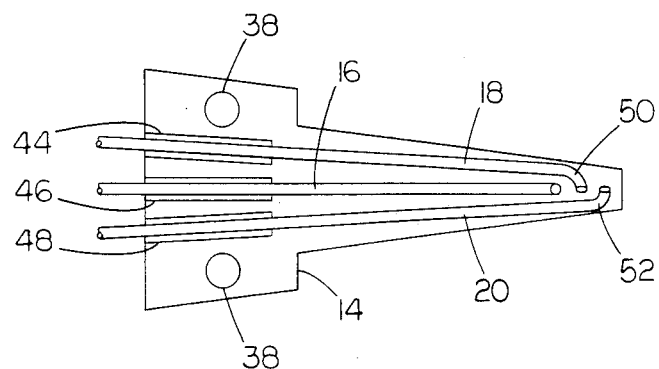
FIG. 3 is a plan view of a support plate and attached wires of the FIG. 1 probe.

Referring to FIGS. 1 through 3, there is shown probe 10 including guide plate 12 (0.015 inch thick glass-filled epoxy board available under the trade designation G10), support plate 14 (0.062 inch thick G10 material) and 0.020 inch diameter tungsten wires 16, 18, 20 (G.E. Alloy 218) sandwiched therebetween and having contact tip portions 22, 24, 26, extending from holes 28, 30, 32, respectively, through guide plate 12. Guide plate 12 and support plate 14 are secured between cover 34 and base 36 by screws (not shown) through holes 38. Holes 28, 30, 32 are 0.020 inch in diameter and are spaced along axis 40 by center-to-center distances of 0.030 ±0.001 inch. Tip portions 22, 24, 26 extend above upper probe surface 42 of guide plate 12 by 0.025 +0.005 −0.000 inch. Tip portions are tapered to sharp points to improve contact and repeatability. Wires 16, 18, 20 are soldered to conductive pads 44, 46, 48 on the upper surface of support plate 14 and have right angle bends where they enter holes 28, 30, 32. Wires 18, 20 also have jogs 50, 52 near their respective holes to avoid electrical contact with other wires.

OPERATION

The operation of probe 10 is is general similar to that described in the above-mentioned patent. Contact tip portions 22, 24, 26 are placed against a lead of an integrated circuit being tested by an operator engaging probe 10 near cover 34 and base 36. Guide plate 12 and support plate 14 flex slightly, and the sharp tungsten alloy contact tips dig into the lead providing good electrical contact with it. Holes 28, 30, 32 keep the tip portions accurately aligned and correctly spaced during measurement, improving repeatability, By soldering wires 16, 18, 20 to conductive pads 44, 46, 48, they are securely positioned.

OTHER EMBODIMENTS

Other embodiments of the invention are within the scope of the following claims.

What is claimed is:

1. A hand-held probe for electrically contacting the lead of a mounted electronic component with a plurality of contact tip portions spaced from each other along said lead so as to provide a segment of desired length between said tip portions, said probe comprising a probe guide member made of insulating material and having a probe surface adapted to be brought into close proximity to said lead and a plurality of holes extending through said member from said probe surface to another surface, electrical wires positioned in said holes and having tip portions extending from said probe surface, said holes being located at said probe surface so as to cause said tip portions to be spaced from each other by said desired length, and a support attached to said guide member, said wires being sandwiched between said support and said guide member, said guide member covering said wires, said wires bending where said holes end at said another surface to provide said contact tip portions along contact axes that are transverse to said probe surface, said guide member and support having respective base ends, being secured to each other at said base ends, and extending separately in cantilever fashion from said base ends along longitudinal axes that are transverse to said contact axes, said guide member and support having a dimension in a direction parallel to said contact axes that is less than the dimensions along said longitudinal axes and axes transverse to said longitudinal axes and contact axes, thereby providing low profile to said probe when said probe surface is in close proximity to said lead.

2. The probe of claim 1 wherein said guide member has three holes that are located at said probe surface at desired position and spacing, and there are three wires.

3. The probe of claim 2 wherein said holes are along an axis at said probe surface and have equal lengths.

4. The probe of claim 1 wherein said probe surface is flat and said another surface is a flat surface that is parallel to said probe surface.

5. The probe of claim 4 wherein said support is made of insulator material and carries conductive pads on said facing surface, and wherein said wires are soldered to said conductive pads.

6. The probe of claim 5 wherein said guide member and said support are flat plates that are flexible to provide movement along said contact axes that is perpendicular to said probe surface when held at a position spaced from said tip portions.

7. The probe of claim 1 wherein said wires comprise tungsten.

8. The probe of claim 6 wherein said wires comprise tungsten.

9. The probe of claim 6 wherein said guide member and support are made of glass-filled epoxy board.

10. The probe of claim 3 wherein said equal lengths are 30 mils.

11. The probe of claim 10 wherein said tip portions extend from said probe surface 25 mils.

* * * * *